United States Patent
Amr et al.

(10) Patent No.: US 10,858,912 B2
(45) Date of Patent: Dec. 8, 2020

(54) SYSTEMS AND METHODS FOR OPTIMIZING PRODUCTION OF UNCONVENTIONAL HORIZONTAL WELLS

(71) Applicant: Raisa II Holdings, LLC, Denver, CO (US)

(72) Inventors: Salma Amr, Cairo (EG); Hadeer El-Ashhab, Giza (EG); Motaz El Saban, New Cairo (EG); Paul Schietinger, Broomfield, CO (US); Ayman Kaheel, Denver, CO (US); Curtis Caile, Castle Rock, CO (US); Luis Rodriguez, Austin, TX (US); Pam Logan, Golden, CO (US); Maria Henry, Littleton, CO (US); Cheryl Poteet, Denver, CO (US)

(73) Assignee: RAISA II HOLDINGS, LLC, Denver, CO (US)

( * ) Notice: Subject to any disclaimer, the term of this patent is extended or adjusted under 35 U.S.C. 154(b) by 246 days.

(21) Appl. No.: 16/017,613

(22) Filed: Jun. 25, 2018

(65) Prior Publication Data
US 2019/0284910 A1 Sep. 19, 2019

Related U.S. Application Data

(60) Provisional application No. 62/642,223, filed on Mar. 13, 2018.

(51) Int. Cl.
*E21B 49/00* (2006.01)
*E21B 41/00* (2006.01)
(Continued)

(52) U.S. Cl.
CPC ........ *E21B 41/0092* (2013.01); *E21B 43/267* (2013.01); *E21B 49/00* (2013.01); *E21B 49/08* (2013.01); *G06N 20/00* (2019.01)

(58) Field of Classification Search
CPC ..... E21B 41/0092; E21B 49/00; E21B 49/003
See application file for complete search history.

(56) References Cited

U.S. PATENT DOCUMENTS

2013/0248250 A1* 9/2013 Bittar ................ E21B 47/00
175/45

OTHER PUBLICATIONS

Roger N. Anderson, et al., "Petroleum Analytics Learning Machine to Forecase Production in the Wet Gas Marcellus Shale", URTEC, 2016.
(Continued)

*Primary Examiner* — Catherine Loikith
(74) *Attorney, Agent, or Firm* — Lathrop GPM, LLP

(57) ABSTRACT

Systems and methods for optimizing production of unconventional horizontal wells. A method for optimizing production of a resource from an unconventional horizontal well comprises compiling values for predictor parameters and target parameters for each of a plurality of known wells. The method includes generating a model for anticipating production of the unconventional horizontal well. The method comprises using a production optimizer and the model to determine a physical parameter change for increasing the anticipated production from the unconventional horizontal well. The method includes communicating the physical parameter change to a rig. The method comprises causing the rig to make the physical parameter change to the unconventional horizontal well.

18 Claims, 12 Drawing Sheets

| Predictor parameters 302 |
|---|
| Well location 404 |
| Geological features 406 |
| Well Operator 408 |
| Engineering features 410 |
| Well formation type 412 |
| Past production data of well (monthly yearly) 414 |
| Production of similarly situated neighboring wells 416 |
| Well density at location 418 |
| Gas to Oil ratio 419A |
| Water to Oil ratio 419B |
| Nearest well distance (distance between existing wells) 420 |
| Nearest well Angle 422 |

(51) Int. Cl.
 E21B 49/08 (2006.01)
 E21B 43/267 (2006.01)
 G06N 20/00 (2019.01)

(56) References Cited

OTHER PUBLICATIONS

L. Crnkovic-Friis, Petarion Energy, "Geology Driven EUR Prediction Using Deep Learning", URTEC 2015.
A. Lindsey et al., "Fast, Accurate, Easy—Pick 3: Using Monthly Production Emsembles for EUR Estimation", URTEC 2016.
Q. Cao (Schlumberger), "Data Driven Production Forecasting Using Machine Learning", SPE Argentina Exploration and Production of Unconventional Resources Symposium, Jun. 1-3, Buenos Aires, Argentina 2016.
Kamari, et al., "Decline Curve Based Models for Predicting Natural Gas Well Performance", in Petroleum ScienceDirect, vol. 3, Issue 2, Jun. 2017, pp. 242-248.
Jorge Guevara, et al., A Data-Driven Workflow for Predicting Horizontal Well Production Using Vertical Well Logs, arxiv. May 2017, https://arxiv.org/pdf/1705.06556.pdf.
Te Stroet, et al., "Predicting Sweet Sports in Shale Plays by DNA Fingerprinting and Machine Learning", URTEC 2017.
Guo et al., "EUR Assessment of Unconventional Assets Using Machine Learning and Distributed Computer Techniques", URTEC 2017.

* cited by examiner

| Predictor parameters 302 |
|---|
| Well location 404 |
| Geological features 406 |
| Well Operator 408 |
| Engineering features 410 |
| Well formation type 412 |
| Past production data of well (monthly/yearly) 414 |
| Production of similarly situated neighboring wells 416 |
| Well density at location 418 |
| Gas to Oil ratio 419A |
| Water to Oil ratio 419B |
| Nearest well distance (distance between existing wells) 420 |
| Nearest well Angle 422 |

FIG. 4A

| Target variables 304 |
|---|
| di 434 |
| qi 436 |
| EUR 438 |

FIG. 4B

| Predictor Parameters 302 | qi – Model 702 | di – Model 704 |
|---|---|---|
| Formation type 412 | ✓ | ✓ |
| Gas to oil ratio 419A, and particularly:<br>   Gas to oil ratio_30 days;<br>   Gas to oil ratio_60 days; and<br>   Gas to oil ratio_90 days | ✓ | ✗ |
| Water to oil ratio 419B, and particularly:<br>   Water to oil ratio_90 days | ✓ | ✗ |
| Well location information 412, and particularly:<br>   Surface latitude;<br>   Surface longitude;<br>   Bottom latitude; and<br>   Bottom longitude | ✓ | ✓ |
| Engineering features 410, and particularly:<br>   Lateral length;<br>   Proppant per lateral segment; and<br>   Water per lateral segment | ✓<br>✓<br>✓ | ✓<br>✗<br>✗ |
| Geological features 406, and particularly:<br>   BVHH;<br>   BVHH-Neighbor;<br>   NET;<br>   NET-Neighbor;<br>   SWA;<br>   SWA-Neighbor;<br>   PHIA; and<br>   PHIA-Neighbor | ✓ | ✓ |
| Past production data of neigh. wells 416, and particularly:<br>   3 month cumulative prod (neighbor);<br>   6 month cumulative prod (neighbor);<br>   9 month cumulative prod (neighbor);<br>   di (neighbor); and<br>   qi (neighbor) | ✓ | ✓ |
| Nearest well distance 420 | ✓ | ✗ |
| Nearest well angle 422 | ✓ | ✗ |
| Nearest well distance 420 | ✓ | ✗ |
| Nearest well angle 422 | ✓ | ✗ |

FIG. 7

| Predictor parameters of Well-Considered 520 | Value |
|---|---|
| Formation | NIOBRARA |
| Gas to oil ratio_30 days | 1186.02 |
| Gas to oil ratio_60 days | 991.22 |
| Gas to oil ratio_90 days | 1102.11 |
| Water to oil ratio_90 days | 0.461 |
| Surface latitude | 40.73481 |
| Surface longitude | -103.8955 |
| Bottom latitude | 40.73691 |
| Bottom longitude | -103.8807 |
| Lateral Length | 3994 |
| Proppant per lateral segment | 791.47 |
| Water per lateral segment | 791.47 |
| BVHH | 2.7445 |
| BVHH-Neighbor | 2.465331 |
| NET | 36.78142 |
| NET-Neighbor | 34.30945 |
| SWA | 0.3520985 |
| SWA-Neighbor | 0.3588063 |
| PHIA | 0.1151576 |
| PHIA-Neighbor | 0.1116616 |
| 3 month cumulative production | 45128.92 |
| 6 month cumulative production | 69595.5 |
| 12 month cumulative production | 69595.5 |
| di (neighbor) | 0.35 |
| qi (neighbor) | 1463.622 |
| Nearest well distance | 76.8172 |
| Nearest well angle | 108.1383 |

FIG. 8

Economic Forecasting Comparison

| Actual Value of Well-Considered 502 | Value of Well-Considered 502 Using Baseline Method | Value of Well-Considered 502 Using Machine Learning Models 306 |
|---|---|---|
| $240k | $512k | $288k |

FIG. 10

| Accuracy tabulation 1100 of the qi and di models | | |
|---|---|---|
| Predicted target variable 302 | NPLs or PLs | Accuracy |
| di | PL | 87.82 |
| di | NPL | 80.97 |
| qi | PL | 97.31 |
| qi | NPL | 81.89 |

FIG. 11

| Sample study 1200 of effect on EUR prediction accuracy based on additional predictor parameters | | | |
|---|---|---|---|
| Target Variable 304 | NPL or PL | Accuracy | Features added |
| EUR | PL | 93.27 | None |
| EUR | PL | 92.93 | P10, P90 |
| EUR | PL | 93.11 | P10, P90, near well distance, near well angle |
| EUR | PL | 93.15 | P10, P90, nearest well distance, nearest well angle, proppant |
| EUR | PL | 92.77 | P10, P90, nearest well angle, proppant, Water to Oil ratio |
| EUR | PL | 92.76 | P10, P90, nearest well angle, proppant, Gas to Oil ratio, Water to Oil ratio |
| EUR | NPL | 72.39 | None |
| EUR | NPL | 72.67 | P10, P90 |
| EUR | NPL | 72.4 | P10, P90, near well distance, near well angle |
| EUR | NPL | 74.11 | P10, P90, nearest well distance, nearest well angle, proppant |
| EUR | NPL | 76.74 | P10, P90, nearest well angle, proppant, Gas to Oil ratio, Water to Oil ratio |

FIG. 12

SYSTEMS AND METHODS FOR OPTIMIZING PRODUCTION OF UNCONVENTIONAL HORIZONTAL WELLS

CROSS-REFERENCE TO RELATED APPLICATIONS

This application claims priority to U.S. Provisional Patent Application No. 62/642,223, filed Mar. 13, 2018. The disclosure of each of these applications is incorporated by reference herein in its entirety.

FIELD OF THE DISCLOSURE

The disclosure relates generally to the field of optimizing production of oil and/or gas from unconventional horizontal wells. More specifically, the disclosure relates to systems and methods for determining and making physical changes to wells to increase the production thereof.

SUMMARY

Systems and methods for anticipating and optimizing production of unconventional horizontal wells are disclosed herein. In an embodiment, a method for optimizing production of a resource from an unconventional horizontal well comprises compiling values for predictor parameters and target parameters for each of a plurality of known wells. The method includes generating a model for anticipating production of the unconventional horizontal well. The model uses empirical relationships between the predictor parameters and the target parameters to anticipate the production of the unconventional horizontal well. The method comprises using a production optimizer and the model to determine a physical parameter change for increasing the anticipated production from the unconventional horizontal well. The method includes communicating the physical parameter change to a rig. The method comprises causing the rig to automatically make the physical parameter change to the unconventional horizontal well. The predictor parameters include information about each of a well location, a geological feature, a well operator, an engineering feature, a well formation, a gas to oil ratio, and a well density.

In another embodiment, a method for optimizing production of a resource from an unconventional horizontal well comprises compiling values for predictor parameters and target parameters for each of a plurality of known wells. The method includes generating a model for anticipating production of the unconventional horizontal well. The method comprises using a production optimizer and the model to determine a physical parameter change for increasing the anticipated production from the unconventional horizontal well. The method includes communicating the physical parameter change to a rig. The method comprises causing the rig to make the physical parameter change to the unconventional horizontal well.

In yet another embodiment, a method for optimizing production of a resource from an unconventional horizontal well comprises compiling values for predictor parameters and target parameters for each of a plurality of known wells. The method includes generating a model for anticipating production of the unconventional horizontal well. The method comprises using a production optimizer and the model to determine a physical parameter change for optimizing the anticipated production from the unconventional horizontal well. The method includes communicating the physical parameter change. The method comprises estimating a worth of the unconventional horizontal well over the course of its life based on the optimized production.

BRIEF DESCRIPTION OF THE SEVERAL VIEWS OF THE DRAWINGS

Illustrative embodiments of the present disclosure are described in detail below with reference to the attached drawing figures and wherein:

FIG. 4A is a tabulation of example predictor parameters usable by the system of FIG. 2.

FIG. 4B is a tabulation of example target parameters determined by the system of FIG. 2 using one or more predictor parameters of FIG. 4A.

FIG. 7 shows predictor parameters of FIG. 4A in additional detail, as they relate to the generation of each of a qi model and a di model.

FIG. 8 shows predictor parameters and their associated values for an actual horizontal well.

FIG. 10 shows an economic forecasting comparison illustrating the increased accuracy with which economic evaluation of horizontal wells may be conducted using the system of FIG. 2.

FIG. 11 shows accuracy values associated with certain di models and qi models.

FIG. 12 shows the impact of adding one or more predictor parameters to models generated by the system of FIG. 2.

DETAILED DESCRIPTION

The oil and gas industry is a trillion dollar industry and, according to some estimates, makes up over 5% of the global economy. To evaluate the economics of oil and gas projects and associated land acquisitions, it is important to anticipate how much oil and/or gas a well will profitably produce over the course of its life. One may then use the anticipated yearly production of the oil wells to, e.g., forecast via a speared process oil and gas prices over the coming years, together with costs associated with operation of the wells.

There are many different types of oil and gas resources. The term resources is often used as a collective term for all recoverable volumes of oil and gas. The resources are typically classified according to their maturity with regard to development and production. In the oil and gas industry parlance, the resources may be divided into three main categories—reserves, contingent resources, and undiscovered resources. Reserves are the volumes of oil and gas that a party has decided to recover. Contingent resources are resources that have been proven, but about the production of which no decision has yet been made. Undiscovered resources are estimated quantities of oil and gas that are present in a resource but which have not yet been proven by drilling. This disclosure focuses primarily on Producing Locations ("PLs") and Nonproducing Locations ("NPLs") for unconventional horizontal wells. NPLs include reserves that have the likelihood of producing oil and/or gas.

Figure 1:
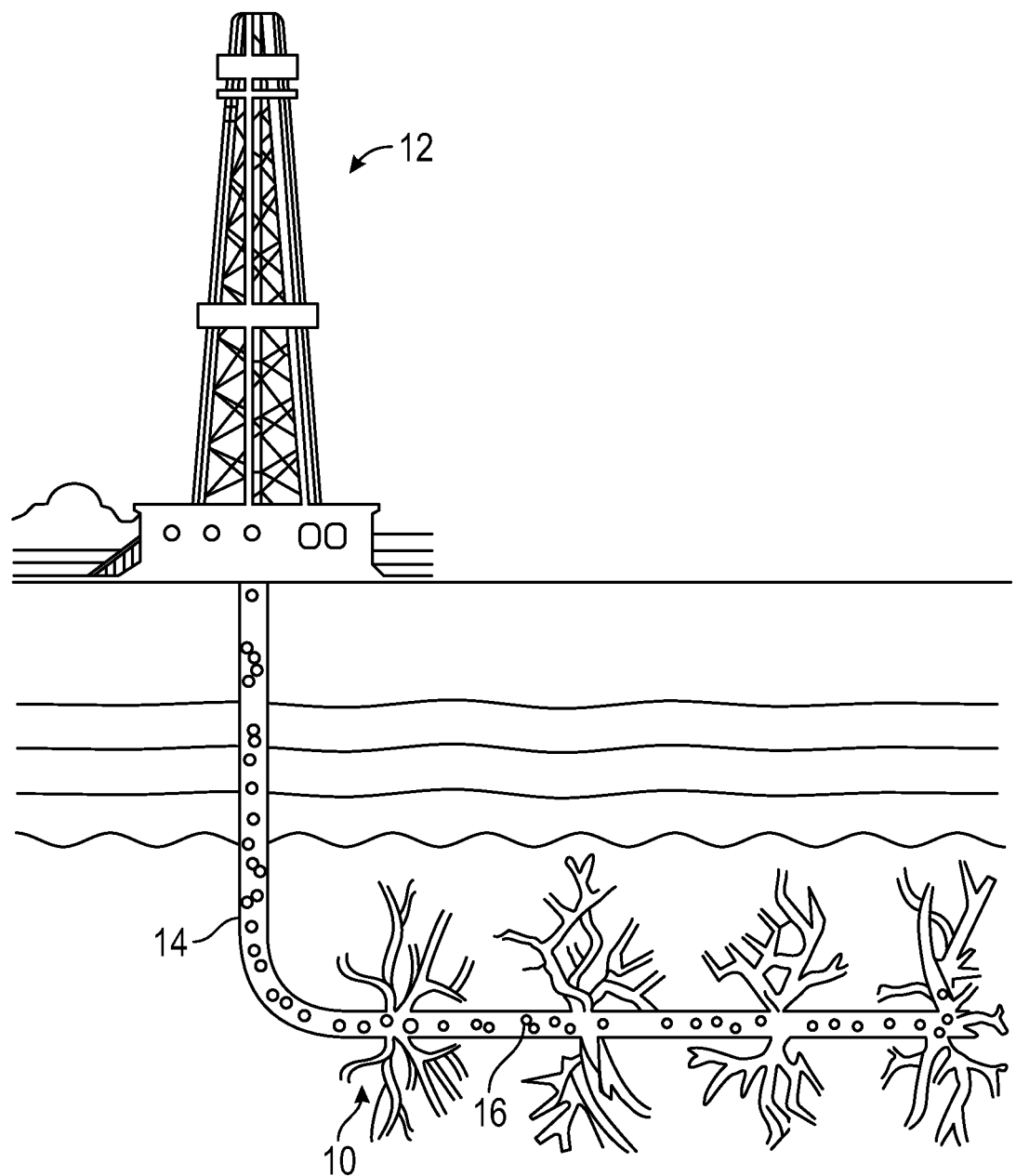
FIG. 1 schematically illustrates a rig usable to drill an unconventional horizontal well.

For context, FIG. 1 shows an unconventional horizontal well 10 together with an oil rig 12, as is known in the art. The horizontal well 10 has a vertical portion 14 and a horizontal portion 16 extending therefrom. The vertical portion 14 and the horizontal portion 16 need only be generally vertical and generally horizontal, respectively. The "oil rig" 12, as the phrase is used herein, refers collectively to any apparatus usable to drill and service the horizontal well 10 (e.g., the heavy equipment, the drill bit, the machinery used to deliver proppant slurries at high pressure during the fracturing process, etc.). The "oil rig" 12 may also be referred to herein as a drilling apparatus 12. While not expressly shown in FIG. 1, the rig 12 may have one or more computing systems that allow for the operation of the rig 12 to be controlled and monitored. For example, an operator may be able to use these rig computing systems to cause the rig 12 (e.g., one or more subsystems thereof) to dispense a selected amount of proppant into the well, to cause the rig 12 to drill a well having particular dimensions, and to effectuate other such operations related to well drilling and production.

In the prior art, well production of unconventional horizontal NPLs is forecasted as follows. First, neighboring wells of the NPL well under consideration are determined. Neighboring wells of the well under consideration are, in general, those wells that have similar geological characteristics, engineering characteristics, operators, etc., and which are proximate (e.g., within a few feet, within a mile, within a few miles in the same basin, etc.) the well under consideration. From the set of the neighboring wells, a type curve (TC) well whose production is representative of the well under consideration for a time period is constructed and evaluated.

In more detail, a neighboring set of wells for the well under consideration is determined, and the set of wells is time aligned as if the production from all these wells started at the same time. Then, three production estimate curves are generated from the set of production curves of all the neighboring wells. The three production estimate curves may include a curve showing the 10 percentile production of all wells, a curve showing the median production (i.e., 50 percentile) of all wells, and a curve showing the 90 percentile production of all wells. For each of these percentile curves, a least squares fit for a hyperbolic-to-exponential curve may be generated, as is typical in the oil and gas industry, for horizontal well production profiles with Arps' trending equations. The artisan understands that the Arps' equations are named after J. J. Arps, an American geologist who published in the 1940s a mathematical relationship for the rate at which oil production from a single well declines over time.

For PLs, estimating of the production of a well under consideration involves collecting known production data of the well and to fit thereon a hyperbolic-to-exponential curve using standard Arps' equations leading to estimated qi, di and b. As is known, qi refers to the initial production rate, di refers to the initial decline rate, and b is the Arps' decline curve exponent.

The methods described above are now an industry standard and have been used to anticipate production of NPLs and PLs for over fifty years. Applicant has discovered, however, systems and methods that are able to anticipate production of unconventional horizontal wells (i.e., NPLs and PLs) with greater accuracy. More specifically, Applicant has developed self-learning systems and methods that employ machine learning to more accurately estimate the production of unconventional horizontal wells (NPLs and PLs). Applicant's systems and methods allow for a unified treatment of both NPLs and PLs, thereby allowing the same set of algorithmic tuning routines to be applied in all cases (with the one notable exception that in case of PL an important part of the feature set comes from the well production itself). Moreover, Applicant's systems and methods employ variables (e.g., information such as operator information, engineering information, well formation information, etc., as discussed in more detail herein) not heretofore used to anticipate oil and gas production, and by modeling their interdependencies, obtain higher prediction accuracies than the prior art.

Importantly, in addition to anticipating production of unconventional horizontal wells using machine learning and variables not heretofore used for such forecasting, the disclosed systems and methods allow for the evaluation of relationships between the one or more variables and total production (e.g., estimated ultimate recovery or "EUR"). That is, based on Applicant's discovery of the mapping between these variables (which, as noted, were not previously utilized for anticipation of production) and total production, the disclosed systems and methods allow for the optimization (e.g., increase) of well production. For instance, the disclosed systems and methods may allow one to determine the impact (e.g., a positive impact or a negative impact) on EUR of using more proppant during the fracturing process, using more water, increasing or decreasing the lateral length of the well, etc. The term parameters may be interchangeably used herein to refer to variables.

Figure 2:
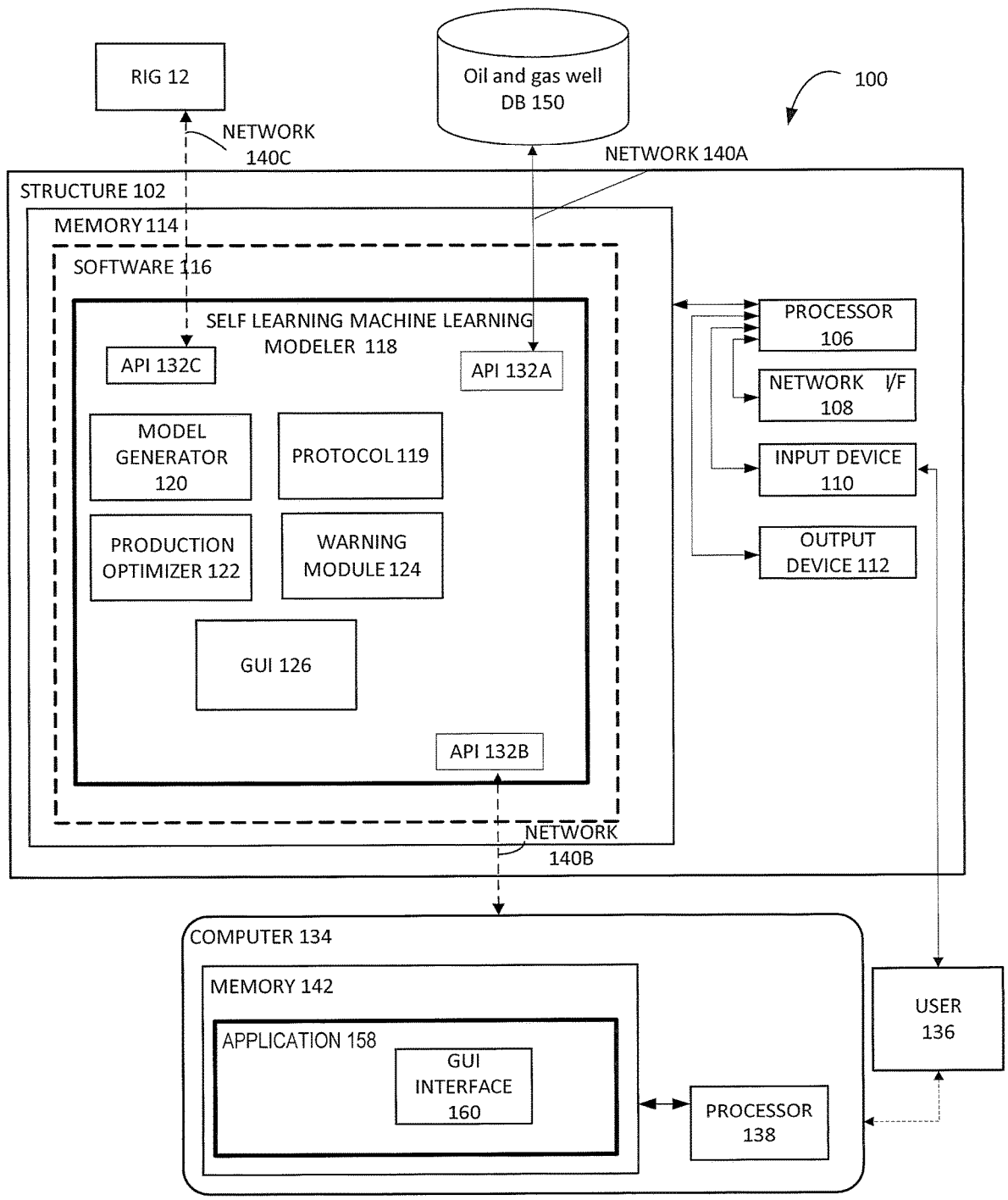
FIG. 2 schematically illustrates a system for anticipating and optimizing production of horizontal wells.

FIG. 2 shows an example self-learning system 100, according to an embodiment. The self-learning system 100 may employ machine learning to generate a machine learning model to forecast production of unconventional horizontal oil wells (NPLs and PLs). The system 100 may further be usable to determine steps (specifically, one or more physical actions) that may be taken optimize production from such oil wells. In embodiments, the system 100 may also be usable to warn an operator that the production of a particular horizontal oil well is suboptimal.

The system 100 may be implemented using a structure 102. The structure 102 may be a computing device, such as a desktop computer, a laptop computer, a smart phone, a tablet, a web server or other server, and the like. In embodiments, the structure 102 may be a dedicated computing device adapted to operate in line with the teachings of the present disclosure.

The structure 102 may include a processor 106, which may be in data communication with a network interface 108, an input device 110, an output device 112, and a memory 114. Processor 106 represents one or more digital processors. Network interface 108 may be implemented as one or both of a wired network interface and a wireless network interface, as is known in the art. The input device 110 may include a keyboard, a mouse, a stylus pen, buttons, knobs, switches, and/or any other device that may allow a user to provide an input to the system 100 via the structure 102. In some embodiments, the input device 110 may comprise a media port (such as a USB port or a SD or microSD port) to allow for media (e.g., a USB drive, a SD or micro SD drive, a laptop memory, a smart phone memory, and the like) to be communicatively coupled to the structure 102. The output device 112 may include one or more visual indicators (e.g., a display, touch screen), audible indicators (e.g., speakers), or any other such output device now known or subsequently developed. In some embodiments, at least a part of the input device 110 and the output device 112 may be combined.

Although shown within the structure 102, memory 114 may be, at least in part, implemented as network storage that is external to the structure 102 and accessed via the network interface 108. The memory 114 may house software 116, which may be stored in a transitory or non-transitory portion of the memory 114. Software 116 includes machine readable instructions that are executed by processor 106 to perform the functionality described herein. In some example embodiments, the processor 106 may be configured through particularly configured hardware, such as an application specific integrated circuit (ASIC), field-programmable gate array (FPGA), and the like, and/or through execution of software (e.g., software 116) to perform functions in accordance with the disclosure herein.

The software 116 may, in embodiments, include a self-learning machine learning modeler 118. The modeler 118 may, in some embodiments, be an application, such as a mobile application configured for an Android, Apple, or other device, or as a computer application configured for a computer 134 in communication with the structure 102, such as a desktop, laptop, or mobile computer, and the like. The modeler 118 may include a model generator 120, a production optimizer 122, and a warning module 124. The model generator 120 may generate a machine learning model using data stored in the oil and gas well database 150 (discussed further below). The production optimizer 122 may be configured to determine one or more physical parameter changes that may be effectuated to optimize production of the horizontal well. The warning module 124 may be configured to generate a warning. The warning may be generated based upon a determination that the production of the horizontal well (e.g., the well 10) is suboptimal, and may, in embodiments, be wirelessly communicated to an operator of the well or other such party.

In embodiments, the structure 102 may be a server (e.g., a web server) and a user may interact with the structure 102 via a computer 134 in communication therewith. The computer 134 may be a mobile or other computer, and may include a processor 138 in communication with memory 142. In an embodiment, computer 134 is a stationary computer.

A user 136, who may, e.g., be a person tasked with forecasting production of a certain horizontal well or another person, may download the application or program 158 onto computer 134 that enables the computer 134 to communicate with the structure 102 via API 132B. The application 158 is software stored in a non-transitory portion of memory 142, and includes machine readable instructions that are executed by processor 138 to improve functionality of computer 134 and to allow communication with structure 102. In embodiments, application 158 may provide a graphical user interface 160 that prompts the structure 102 to activate the model generator 120, the production optimizer 122, the warning module 124, etc. In other embodiments, one or more of the modules 120, 122, 124 may be activated automatically (e.g., the warning module 124 may automatically generate a warning based upon a determination that the production of an oil well is suboptimal).

The structure 102, via the API 132A, may selectively communicate over a network 140A with an oil and gas well database 150. The oil and gas well database 150 may be a storage medium, such as an optical hard drive or other medium, for storing oil and gas well information data as discussed herein. The modeler 118 may be usable to import data from and/or expert data to the database 150.

The structure 102 is shown as being in communication with the computer 134 being used by a user 136 (shown in dashed lines in FIG. 1) or the user 136 may interact with the structure 102 using the input device 110 (and/or the output device 112). While the structure 102 is shown as being in communication with a solitary computer, the artisan will appreciate from the disclosure herein that the structure 102 may likewise be configured to communicate with several computers and the multiple users thereof may be unrelated to each other.

In one embodiment, the structure 102 is an online structure 102 which, using protocol 119 and application programming interface (API) 132B, may communicate over a wireless network 140B with the computer 134, such as a desktop computer, mobile computer, a laptop, notebook, tablet, smartphone, et cetera. Protocol 119 may be any known internet protocols, such as, IPv6, IPv8, and the like used in the art now or protocols not yet developed.

In embodiments, the structure 102, e.g., the self-learning machine learning modeler 118 thereof, may further communicate with a rig (such as the rig 12 in FIG. 1) over API 132C and a network 140C to control one or more operations of the rig 12. The network 140C may be the same as the network 140A and/or 140B, or a different network.

Figure 3:
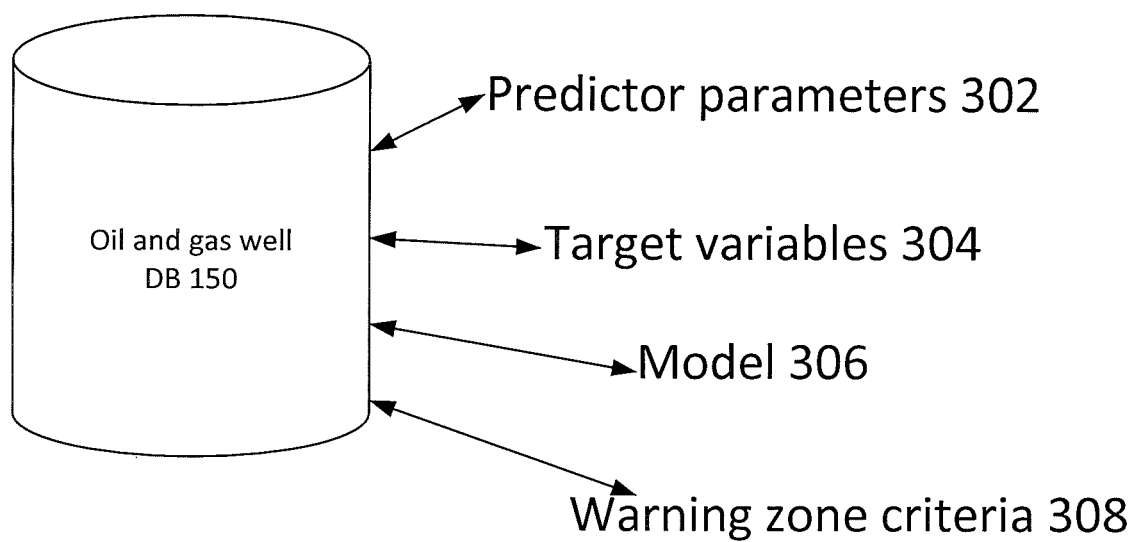
FIG. 3 schematically illustrates an oil and gas well database of the system of FIG. 2.

FIG. 3 shows the type of data that may be stored in the oil and gas well database 150, in an embodiment. In the illustrated example, the oil and gas well database 150 comprises predictor parameters 302, target variables 304, one or more machine learning models 306 generated by the model generator 120 based on said predictor parameters 302 and target variables 304, warning zone criteria 308, etc. In an embodiment, the predictor parameters (or variables) 302 may comprise data input to the model generator 120. The model generator 120 may generate the machine learning model 306 by mapping this data to the target variables 304 based on empirical relationships the model generator 120 determines between the predictor parameters 302 and the target variables 304.

FIG. 4A shows the predictor parameters 302, in an embodiment. The predictor parameters 302 may include, well location information 404, information about geological features 406, well operator information 408, engineering feature information 410, information regarding well formation type 412, past production data of the well 414, production of similarly situated neighboring wells 416, well density information 418, gas to oil ratio 419A, water to oil ratio 419B, nearest well distance information 420, nearest well angle information 422, etc. Each of these parameters 302 are discussed in more detail herein. The artisan will understand from the disclosure herein that each of these parameters 302 (i.e., each of the parameters 404-422) may be usable to forecast well production of both PLs and NPLs, except that the information 414 regarding past production data of wells may be available only for PLs. As outlined herein, the collection of predictor parameters 302 shown in FIG. 4A have not heretofore been used to forecast well production. The database 150 may contain the predictor parameters 302 for many known wells (such as for many hundreds of wells, hundreds of thousands of wells, etc.), and the model 306 may employ these predictor parameters 302 to, among other things, predict the oil production information of a well under consideration (e.g., a NPL or a PL). In embodiments, the predictor parameters 302 stored in the database 150 may relate to a statistically significant number of known wells. The well under consideration (i.e., the well whose production information is being forecasted using the predictor variables 302 of a statistically significant number of wells) may also be referred to herein as a Well-Considered.

The well location information 404 may include, e.g., TRS information of the known wells. The artisan understands that the phrase TRS information, as used in the oil and gas industry, refers to the legal land description of the oil wells by township, range, and section. In embodiments, the well location information 404 may further include other locational information about each well, such as their state, county, etc.

In embodiments, the predictor parameters 302, and specifically the well location information 404 thereof, may comprise each of surface latitude, surface longitude, bottom latitude, and bottom longitude of each horizontal well. The surface latitude and surface longitude may refer to the coordinates of the well at the surface (i.e., at the location the drilling is started, such as the uppermost part of the vertical portion 14 of well 10). The bottom latitude and the bottom latitude and the bottom longitude may refer the coordinates of the terminal end of the horizontal portion (such as the horizontal portion 16). Specifying well location 404 with each the surface and bottom latitude and the surface and bottom longitude may allow for the location of the well to be identified with greater specificity.

The geological features 406 may include information about the geological features at the well locations, such as the Phia (i.e., average porosity of the net reservoir), Net (i.e., thickness of the net reservoir), SwA (i.e., average water saturation of the net reservoir), BHVV (i.e., bulk volume hydrocarbon thickness, which equals (Phia*(1−SwA)*Net)), etc. The artisan understands that each of the Phia and SwA is measured as a percentage whereas each of the Net and BVHH is measured in units of length, e.g., feet. In embodiments, the geological features 406 may include information about other geological features, such as gas to oil ratio and other such predictors. In some embodiments, the geological features 406 may further comprise geological features of the neighboring reservoirs, such as the Phia, Net, SwA, and BVHH, and gas to oil ratio thereof.

The well operator 408 is assigned to wells based on data gathered from various sources, including existing producing and permitted horizontal wells from entities such as the Colorado Oil and Gas Conservation Commission (COGCC), pending permits from COGCC, COGCC monthly docket listings, investor presentations, etc. In some cases, the top leaseholder in a particular section (i.e., the operator with the greatest number of leases in a given section) may be assigned to unassigned sections. Assignment of the well operator 408 to the wells may allow for production strategies and philosophies of the various operators 408 to be considered when forecasting the production of Well-Considered.

The artisan understands that the fracturing process involves injecting a fluid at a pressure sufficiently high to break down the rock. Proppant slurries may then be pumped into the induced fracture to keep it open so that the hydrocarbon production from the well can be substantially enhanced. The proppant may provide long term conductivity of the fracture, and as such, quantification of proppant amount (and/or type) before a fracturing job may add significant value. The engineering features 410 may include the amount of proppant used in the various wells. The engineering features 410 may also comprise the lateral length of the well (i.e., the length of the generally horizontal portion (such as portion 16 of well 10)), the amount of water per well, etc. In embodiments, for enhanced accuracy, the amount of proppant and the amount of water stored in the database 150 for a particular well may be for a normalized section thereof (e.g., if the lateral length of the well is a mile, each of the proppant amount and the water amount per 500 feet of this lateral length may be stored for increased granularity). The proppant per lateral length segment may be stored in the database 150 in lbs/ft, and the water per lateral length segment may be stored in the database 150 in bbls/ft.

The well formation type 412 may include an identification of the formation associated with the wells, such as a Bakken formation, a three fork formation, etc. The past production data 414 of the wells may include cumulative production data of the wells over previously defined periods of time, such as cumulative production over three months, cumulative production over six months, cumulative production over twelve months, and so on.

The production of similarly situated neighboring wells 416 may include cumulative production data of similarly situated neighboring wells over previously defined time periods, such as three months, six months, twelve months, etc. Identification of the neighboring wells for the Well-Considered may be a prerequisite to the delineation of the production of the neighboring wells. Neighboring wells for the well under consideration may be defined by the set of wells that shares similar geological, engineering, and operator information, and which is proximate the Well-Considered. Ten (or a different number of) neighboring wells may be identified so that the production information thereof could be stored in the database 150.

In embodiments, a well may be considered to be a neighboring well of the Well-Considered where it meets each of the following example conditions (herein, the "initial conditions"): (a) the latitude and longitude of the well is within 2,500 feet from the latitude and longitude of the Well-Considered; (b) the lateral length of the well differs from the lateral length of the Well-Considered by no more than 1,000 feet; (c) the geological properties (and particularly, porosity and permeability) of the well is within 15% of the geological properties of the Well-Considered; (d) the operator of the well is the same as the operator of the Well-Considered; and (e) the formation of the well is the same as the formation of the Well-Considered.

If at least ten neighbors are found, the search process may terminate and production data of these neighbors may be stored as production data of similarly situated neighboring wells 416 of the Well-Considered. Alternately, if at least ten neighbors are not identified, the initial conditions may be relaxed and the following conditions (herein, the "relaxed conditions) may be imposed one by one until ten neighboring wells are identified: (1) same as the initial conditions, except that the latitude and longitude requirements are relaxed and multiplied by two; (2) same as the initial conditions, except that the latitude and longitude requirements are relaxed and multiplied by four; (3) same as the initial conditions (including the same latitude and longitude requirements in initial condition (a)) but now including operators other than the operator of the Well-Considered; (4) same as the initial conditions, except that the latitude and longitude requirements are relaxed and multiplied by two and operators other than the operator of Well-Considered are included; (5) same as the initial conditions, except that the latitude and longitude requirements are relaxed and multiplied by four and operators other than the operator of Well-Considered are included; and (6) same as the initial conditions, except that wells having a lateral length that differs from the lateral length of the Well-Considered by up to 2,000 feet are considered and wells from other operators are also considered. Thus, as can be seen, the initial conditions and the relaxed conditions collectively attribute different weights to various parameters, as it has been discovered that implementation of these conditions provide for a more optimal model (i.e., a model that can forecast the production of Well-Considered with increased accuracy).

Figure 5:
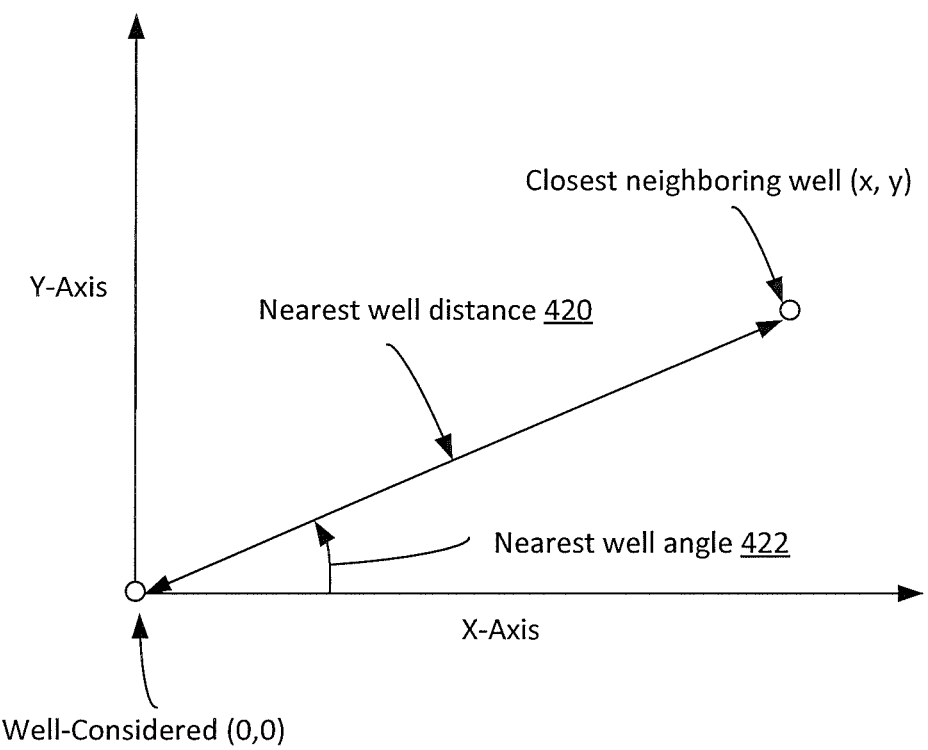
FIG. 5 schematically illustrates a process for determining a nearest well distance and a nearest well angle.

The well density 418 at the location may include information about the number of wells in an area associated with the Well-Considered, such as the section, county, township, etc. thereof. The gas to oil ratio 419A may be the ratio of the gas to the oil for the particular well. The water to oil ratio 419A may be the ratio of the water to the oil for the particular well. The nearest well distance 420 may include the distance between the a particular well and the neighboring well closest thereto. The nearest well angle 422 may include the angle between the particular well and the neighboring well closest thereto. FIG. 5 schematically illustrates the computation of the nearest well distance 420 and the nearest well angle 422.

FIG. 4B shows the target variables 304 computed for the Well-Considered by the machine learning model 306 generated by the model generator 120 in view of the predictor parameters 302. In an embodiment, the target variables 304 may include di 434, qi 436, and EUR 438 of the Well-Considered. As noted above, di 434 is the initial decline rate, qi 436 is the initial production rate, and EUR is the estimated ultimate recovery of the resource.

Figure 6:
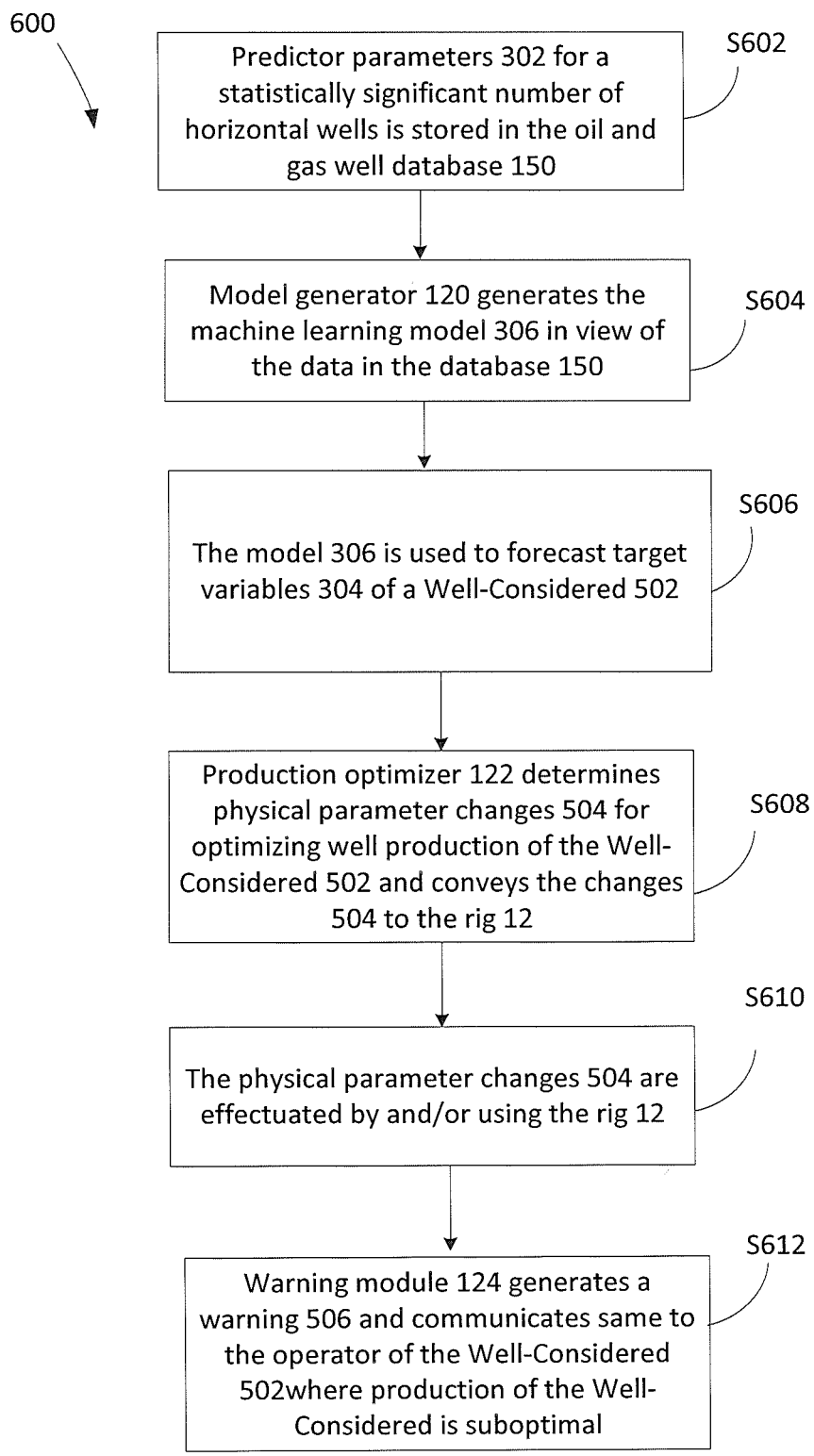
FIG. 6 is flowchart illustrating a method of using the system of FIG. 2 to forecast production of horizontal wells and to optimize this production based on effectuation of physical parameter changes.

FIG. 6 shows a flowchart showing a method 600 of using the system 100 of FIG. 2, in an embodiment. The artisan will understand that the method 600 is merely exemplary and that the system 100 may also be used to effectuate only a part of the method 600.

At step S602, the predictor parameters 302 for a statistically significant number of horizontal wells may be stored in the oil and gas well database 150. At step S604, the model generator 120 may generate the machine learning model 306 in view of the data in the database 150. At step S606, the model 306 generated by the model generator 120 may be used to forecast target variables 304 of a Well-Considered 502. At step S608, the production optimizer 122 may determine physical parameter changes 504 for optimizing well production of the Well-Considered 502, which changes 504 may be conveyed to the rig 12. At step S610, the rig 12 (e.g., a subsystem thereof) may automatically (or with user intervention) bring about the physical parameter changes 504 in the Well-Considered 502 to optimize production. At step S612, the warning module 124 may generate a warning 506 and communicate same to the operator of the Well-Considered 502 based upon a determination that the production of the Well-Considered 502 is suboptimal (relative to the forecasted production).

The method steps S602-S612 will now be outlined in additional detail. At step S602, the user 136 may store in the database 150 (and/or the model generator 120 may automatically scour known sources and collect) the predictor parameters 302 for a statistically significant number of wells. For example, the well location 404, the geological features 406, the well operator information 408, etc., of each of the statistically significant number of wells may be stored in the database 150. For instance, predictor parameters 302 of about 20,000 (or a different number of) horizontal wells from a plurality of basins may be stored in the database 150. The artisan will understand that the accuracy of the model generated by the model generator 120 may increase with an increase in sample size of the wells whose predictor parameters 302 are being stored. In embodiments, the model generator 120 may automatically update the predictor parameters 302 periodically (e.g., once a week, once a day, once a month, etc.) to ensure that the model 306 can employ any additional data that has recently become available.

Step S604 relates to the model generator 120 using the predictor parameters 302 of the statistically significant number of horizontal wells to generate the machine learning model 306 usable to forecast the production of other wells (e.g., to forecast the production of the Well-Considered 502). By using more of the information available about PLs or NPLs, future production of a well over its lifetime with machine learning techniques can be estimated with increased precision relative to the prior art. In a non-limiting example, the model 306 was generated as set forth below. The artisan will understand that the example below is set forth only to illustrate the generation of the model 306 in one embodiment, and that the particulars of the example are not intended to be independently limiting.

First, predictor parameters 302 of a statistically significant number of actual PLs in the U.S. were stored in the database 150. Specifically, in this example, predictor parameters 302 of 15,950 horizontal wells in the Williston basin and 5,646 horizontal wells in the DJ basin were stored in the database 150. While the actual production information of these 21,596 horizontal PL wells (i.e., the training set) was known, this production information was initially hidden from the model generator 120 to allow for algorithm evaluation and to ensure accuracy of the model 506. Once the predictor parameters 302 were so compiled in the oil and gas database 150, the data of the predictor parameters 302 was transformed to root out or at least minimize any apparent inconsistencies therein, so that the trends in the data become more readily apparent (herein, "data smoothing").

For example, in embodiments, the model generator 120 may cause all the numerical features of the predictor parameters 302 to undergo the BoxCox transformation. Alternately or additionally, the model generator 120 may take the log of all numerical features within the predictor parameters 302. In embodiments, the model generator 120 may create synthetic data. The artisan understands that synthetic data generation is a way to generate more data by mimicking relationships between feature values in the actual data points, and in essence, increases the sample size of the training set so that the need for overfitting may be reduced.

One or more machine learning algorithms may be employed to determine the target parameters 304 for the training set (which target parameters 304, as noted, are known). Several machine learning algorithms were employed to optimize the model 306 to obtain the numerical data set forth in the actual example detailed herein. Specifically, these algorithms included: Bayesian regularized neural networks, support vector machine, random forest algorithms, extreme gradient boosting, Stochastic Gradient Boosting, and generalized linear modeling. Then, these machine learning algorithms were fine tuned to enhance accuracy. The term "accuracy" of the model 306, as used herein, connotes: [1—mean of absolute relative difference of the forecasted target variables 304 with respect to the actual target variables 304].

In some embodiments, overfitting was avoided or at least minimized. For example, a slightly lower accuracy may be chosen over a model that achieved a higher accuracy with overfitting. In embodiments, decreasing the number of trees in a random forest algorithm may be employed to minimize overfitting.

In embodiments, the model generator 120 may, in line with the disclosure herein, create two models usable to determine the EUR 438. For example, the model 306 may include a qi model 702 and a di model 704. The well production curve may be parameterized by qi, di, and b (for a given basin, the b may be set to a fixed value as set out by domain experts). FIG. 7 shows the particular predictor parameter 302 used by the model generator 120 to train each of the qi model 702 and the di model 704, in an embodiment. As can be seen, in the illustrated embodiment, certain predictor parameters 302 usable to train the qi model 702 are omitted in the training of the di model 704 (e.g., gas to oil ratio 419A, water to oil ratio 419B, nearest well distance 420, etc. are used in the training of the qi model 702 but not in the training of the di model 704). This is because Applicant's experimentation has shown that use of these parameters in the generation of the di model 704 may have adverse consequences in certain applications. In other applications, both the qi model 702 and the di model 704 may use the same predictor parameters 302.

The dataset corresponding to the predictor parameters 302 in FIG. 7 may contain many data points (e.g., hundreds of data points), each representing a certain horizontal well. In embodiments, qi models 702 may be trained using the xgbTree algorithm with the following tuning parameters: nrounds=100, max_depth=10, eta=0.03, gamma=0.1, colsample_bytree=0.4, min_child_weight=1 and subdample=1. di models 704 may be trained using the svmLinear algorithm (without any tuning parameters, for example). Both models 702 and 704 may be trained and tested using cross validation techniques. qi models 702 and di models 704 developed in line with the disclosure herein have, in terms of accuracy, scored 81.918% and 80.895%, respectively.

Returning to FIG. 6 at step S606, once the machine learning model 306 (i.e., the qi model 702 and the di model 704) is generated by the model generator 120, it may be used to forecast one or more target variables 304 (e.g., the EUR 438) of the Well-Considered 502. As noted above, the Well-Considered 502 may be a NPL or a PL. The machine learning model 306 may use the mapping of the predictor parameters 302 to the target variables 304 of known wells to forecast the target variables (e.g., EUR) of another well in view of its respective target parameters.

Determination of empirical relationships between the predictor parameters 302 and the target variables 304 may also allow for the production optimizer 122 to optimize production of a well under consideration (e.g., Well-Considered 502). For example, based on the data in the database 150 regarding known wells, the models 306 may change one or more of the predictor parameters 302 of the Well-Considered to determine whether such positively impact the target variables 304. For example, when a particular Well-Considered 502 is modeled, the production optimizer 122 may continually vary one or more predictor parameters, such as the proppant amount per lateral segment, the amount of water per lateral segment, the lateral length of the Well-Considered, the well density, etc., to evaluate whether such a physical predictor parameter change 504 boosts EUR. If so, the production optimizer 122 may in embodiments communicate with the rig 12 to cause the physical parameter change 504 to be effectuated (e.g., automatically). For example, where the production optimizer 122 forecasts that increasing (or decreasing) the amount of proppant per lateral segment of the Well-Considered 502 would boost production, the optimizer 122 may cause the rig 12 to automatically employ additional proppant with the Well-Considered 502 so that well production could be optimized. The production optimizer 122 may likewise cause the rig 12 to increase or decrease the actual lateral length of the Well-Considered 502, increase or decrease the amount of water used in the drilling process, etc., where such is dictated by the model 306 to optimize production. In embodiments, the production optimizer 122 may cause the rig 12 to automatically effectuate the physical target parameter change 504. In other embodiments, the production optimizer 122 may determine one or more physical target parameter changes 504 that will increase production and an operator may cause the rig 12 to effectuate said change(s) 504.

In embodiments, the production optimizer 122 may use the machine learning models 306 (e.g., the qi model 702, the di model 704, etc.) to determine the point of diminishing returns for one or more predictor variables 302. For example, the production optimizer 122 may in embodiments determine the point at which increased lateral length (or increased well density, for example) actually decreases returns.

The warning module 124 may serve to generate the warning 506 for transmission to the operator based on a determination that the production of the well (e.g., the Well-Considered 502) is suboptimal. The warning 506 may be communicated wirelessly, e.g., over a telephone network, an internet network, etc. Alternately or in addition, the warning 506 may comprise an audible and/or a visual warning. The warning 506 may warn the operator that something with the operation of the Well-Considered 502 is amiss. The operator may, in response to receipt of the warning 506, determine whether there are mechanical problems, operational problems, etc.

Thus, the models 306 may serve both to increase the accuracy of EUR predictions of wells and to increase production thereof. The prediction accuracy may be enhanced in a basin at issue by combining well data from other similar basins (while, e.g., filtering data to lie within lateral length variations observed in the basin at issue). Indeed, and as discussed herein, models 306 developed by Applicant have significantly outperformed the traditional prior art ways of forecasting EUR of horizontal wells.

Actual Forecasting Example

An example of using the machine learning model 306 to estimate EUR of a well (e.g., the Well-Considered 502) will now be detailed. The data provided in connection with this example is actual data and relates to Well with API "05123390620000." This well (hereinafter, the Well-Considered 502) lies in the DJ-basin, specifically in WELD county in COLORADO. In more detail, the Well-Considered 502 lies in Section 20, Range 58W, and Township 9N. FIG. 8 shows the values of the predictor parameters 302 allocated to the Well-Considered 502, which are used by the model 306 to forecast EUR of the Well-Considered 502.

Figure 9:
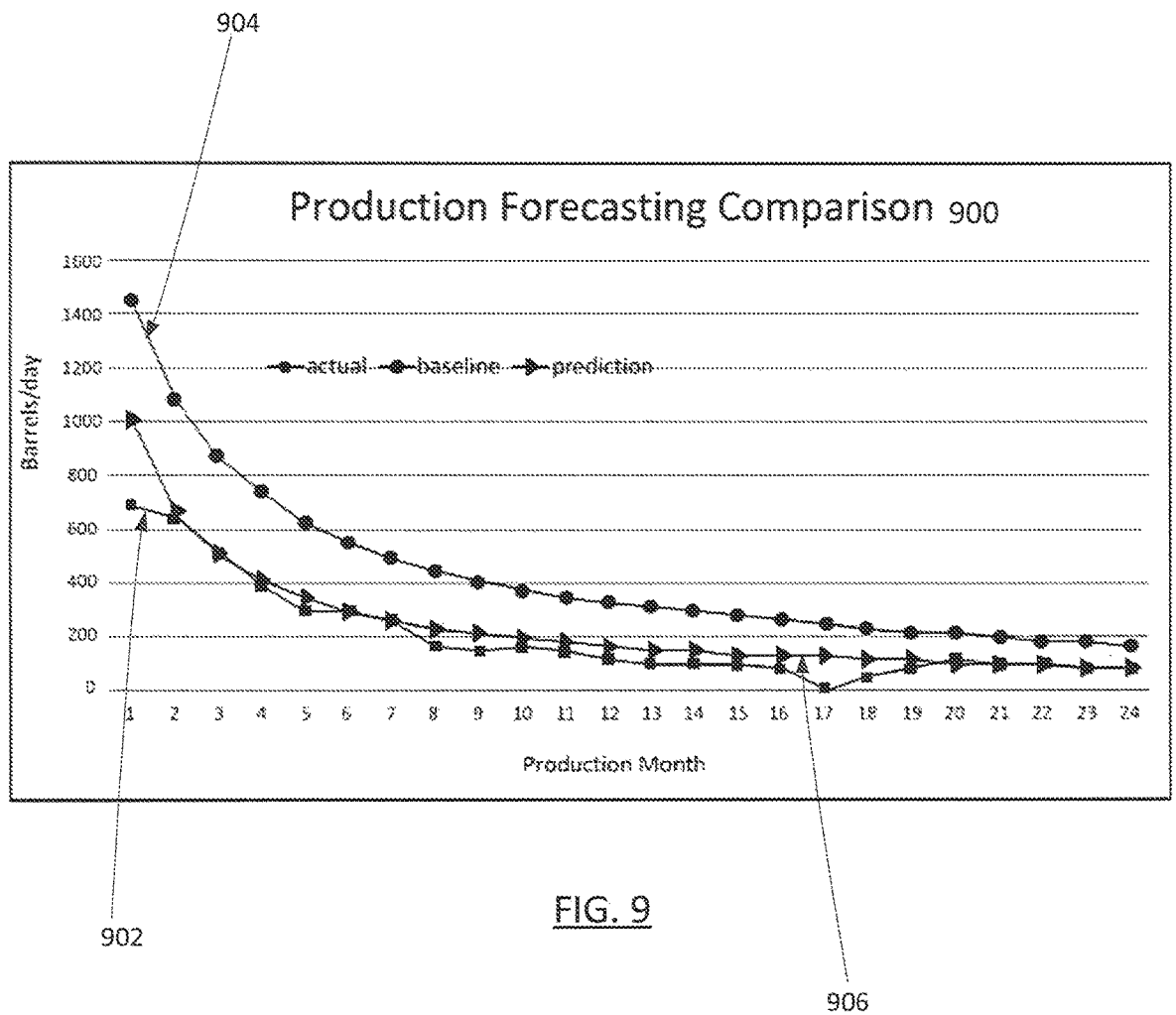
FIG. 9 shows a production forecasting comparison illustrating the enhanced accuracy with which production can be forecasted using the system of FIG. 2.

FIG. 9 shows a production forecasting comparison 900. The comparison 900 includes actual production data 902 of the Well-Considered 502. The FIG. 9 comparison 900 also shows baseline production data 904 of the Well-Considered 502 and forecasted production data 906 of this well as gleaned using the systems and methods disclosed herein. The forecasted production data 906 was generated by the model 306 using the target parameters disclosed in FIG. 8. As can be seen, the forecasted production data 906 more closely aligns with the actual production data 902 as compared to the baseline 904.

FIG. 10 shows the substantial improvement in economic forecasts of the well value over its lifetime that may be achieved using the systems and methods disclosed herein. Specifically, FIG. 10 shows an economic forecasting comparison 1000 of the Well-Considered 502, and includes each of actual well value, well value computed using the baseline data 904, and well value computed using the machine learning model 306. As can be seen, the machine learning model 306 allows for more accurate predictions of the value of the Well-Considered 502 as compared to traditional methods.

FIG. 11 shows an accuracy tabulation 1100 of the qi models 702 and the di models 704. The predictor parameters 302 employed in the qi and di models of the tabulation 1100 include well location 404, well operator 408, well formation 412, certain geological features 406, and data from neighboring wells. FIG. 12 shows the impact on the accuracy of the machine learning models 306 when other features, such as additional predictor parameters 302 for example, are added. As can be seen, addition of certain features to the machine learning models 306 may be undesirable because of their adverse impact on the accuracy of EUR predictions.

Thus, as has been described, the system 100 and associated methods may represent a significant advance over prior art methods usable to forecast production of unconventional horizontal wells, and may, in embodiments, allow for production of such unconventional horizontal wells to be increased by automatically causing the rig 12 to bring about (or otherwise effectuating) physical parameter changes to the well.

Many different arrangements of the various components depicted, as well as components not shown, are possible without departing from the spirit and scope of the present disclosure. Embodiments of the present disclosure have been described with the intent to be illustrative rather than restrictive. Alternative embodiments will become apparent to those skilled in the art that do not depart from its scope. A skilled artisan may develop alternative means of implementing the aforementioned improvements without departing from the scope of the present disclosure.

It will be understood that certain features and subcombinations are of utility and may be employed without reference to other features and subcombinations and are contemplated within the scope of the claims. Not all steps listed in the various figures need be carried out in the specific order described.

The disclosure claimed is:

1. A method for optimizing production of a resource from an unconventional horizontal well, comprising:
   compiling values for predictor parameters and target parameters for each of a plurality of known wells;
   generating a model for anticipating production of said unconventional horizontal well, said model using empirical relationships between said predictor parameters and said target parameters to anticipate said production of said unconventional horizontal well;
   using a production optimizer and said model to determine a physical parameter change for increasing said anticipated production from said unconventional horizontal well;
   communicating said physical parameter change to a rig; and
   causing said rig to automatically make said physical parameter change to said unconventional horizontal well;
   wherein said predictor parameters include information about each of a well location, a geological feature, a well operator, an engineering feature, a well formation, a gas to oil ratio, and a well density, and
   wherein the plurality of known wells for which the values for predictor parameters are compiled includes at least one neighboring well, the at least one neighboring well being determined based upon data characterizing the neighboring well meeting a set of initial conditions.

2. The method of claim 1, wherein said target parameters include information about an initial decline rate and an initial production rate.

3. The method of claim 2, wherein said model includes each of a qi model and a di model.

4. The method of claim 3, wherein said physical parameter change includes at least one of: (a) varying an amount of proppant introduced in said unconventional horizontal well; (b) varying an amount of water introduced in said unconventional horizontal well; and (c) changing a well density.

5. The method of claim 3, wherein said physical parameter change includes varying a lateral length of said unconventional horizontal well.

6. The method of claim 1, further comprising determining a neighboring well based upon data characterizing the neighboring well meeting a set of relaxed conditions, said relaxed conditions being introduced based upon a determination that a set of initial conditions is unmet.

7. The method of claim 1, wherein said model is a machine learning model.

8. The method of claim 1, further comprising generating a warning signal and communicating said warning signal to an operator based upon a determination that said anticipated production of said unconventional horizontal well is suboptimal.

9. A method for optimizing production of a resource from an unconventional horizontal well, comprising:
   compiling values for predictor parameters and target parameters for each of a plurality of known wells;
   generating a model for anticipating production of said unconventional horizontal well;
   using a production optimizer and said model to determine a physical parameter change for increasing said anticipated production from said unconventional horizontal well;
   communicating said physical parameter change to a rig; and
   causing said rig to make said physical parameter change to said unconventional horizontal well,
   wherein the plurality of known wells for which the values for predictor parameters are compiled includes at least one neighboring well, the at least one neighboring well being determined based upon data characterizing the neighboring well meeting a set of initial conditions.

10. The method of claim 9, further comprising periodically updating said values.

11. The method of claim 9, wherein said predictor parameters include information about each of a well location, a geological feature, a well operator, an engineering feature, a well formation, a gas to oil ratio, and a well density.

12. The method of claim 9, wherein said target parameters include information about an initial decline rate and an initial production rate.

13. The method of claim 9, wherein said model includes each of a qi model and a di model.

14. The method of claim 9, wherein said physical parameter change includes varying an amount of proppant introduced in said unconventional horizontal well.

15. The method of claim 9, wherein said physical parameter change includes varying a lateral length of said unconventional horizontal well.

16. The method of claim 9, wherein said physical parameter change includes varying a fluid usable in a well drilling and producing operation.

17. A method for optimizing production of a resource from an unconventional horizontal well, comprising:

compiling values for predictor parameters and target parameters for each of a plurality of known wells;

generating a model for anticipating production of said unconventional horizontal well;

using a production optimizer and said model to determine a physical parameter change for optimizing said anticipated production from said unconventional horizontal well;

communicating said physical parameter change; and estimating a worth of said unconventional horizontal well over the course of its life based on said optimized production, wherein the plurality of known wells for which the values for predictor parameters are compiled includes at least one neighboring well, the at least one neighboring well being determined based upon data characterizing the neighboring well meeting a set of initial conditions.

18. The method of claim 17, wherein each of said plurality of wells is a similarly situated neighboring well.

* * * * *